(12) United States Patent
Boussagol et al.

(10) Patent No.: US 9,011,598 B2
(45) Date of Patent: Apr. 21, 2015

(54) METHOD FOR MAKING A COMPOSITE SUBSTRATE AND COMPOSITE SUBSTRATE ACCORDING TO THE METHOD

(75) Inventors: Alice Boussagol, Brignoud (FR); Frédéric Dupont, Seyssins (FR); Bruce Faure, Grenoble (FR)

(73) Assignee: Soitec, Bernin (FR)

( * ) Notice: Subject to any disclaimer, the term of this patent is extended or adjusted under 35 U.S.C. 154(b) by 2301 days.

(21) Appl. No.: 11/541,192

(22) Filed: Sep. 28, 2006

(65) Prior Publication Data

US 2007/0022940 A1 Feb. 1, 2007

Related U.S. Application Data

(63) Continuation-in-part of application No. 10/915,765, filed on Aug. 10, 2004, now abandoned.

(30) Foreign Application Priority Data

Jun. 3, 2004 (FR) ..................................... 04 05992
Dec. 21, 2005 (FR) ..................................... 05 13042

(51) Int. Cl.
  C30B 33/06 (2006.01)
  C30B 29/38 (2006.01)
  H01L 21/762 (2006.01)
(52) U.S. Cl.
  CPC ....... *H01L 21/76254* (2013.01); *Y10S 117/915* (2013.01)
(58) Field of Classification Search
  USPC .................................. 117/1, 3, 915, 951, 952
  See application file for complete search history.

(56) References Cited

U.S. PATENT DOCUMENTS

| 6,328,796 | B1 | 12/2001 | Kub et al. ........................ 117/94 |
| 6,391,799 | B1 | 5/2002 | Di Cioccio ...................... 438/781 |
| 6,413,627 | B1 | 7/2002 | Motoki et al. ................. 428/332 |
| 6,497,763 | B2 | 12/2002 | Kub et al. ........................ 117/94 |
| 6,533,874 | B1 | 3/2003 | Vaudo et al. ................. 148/33.5 |
| 6,794,276 | B2 * | 9/2004 | Letertre et al. ................ 438/506 |
| 6,946,317 | B2 | 9/2005 | Faure et al. ..................... 438/94 |
| 2003/0064535 | A1 * | 4/2003 | Kub et al. ......................... 438/22 |
| 2003/0138983 | A1 * | 7/2003 | Biwa et al. ....................... 438/46 |
| 2003/0153163 | A1 | 8/2003 | Letertre et al. ................ 438/458 |
| 2003/0198837 | A1 * | 10/2003 | Craven et al. ................. 428/698 |

(Continued)

FOREIGN PATENT DOCUMENTS

| FR | 2 840 730 | 12/2003 |
| JP | 2000-226299 | 8/2000 |

(Continued)

OTHER PUBLICATIONS

Baker et al, "Characterization of Planar Semipolar Gallium Nitride Films on Spinel Substrates," Japanese Journal of Applied Physics, vol. 44, No. 29, 2005 (pp. L920-L922).*
S.C. Binari et al., "H, He, and N Implant Isolation of n-type GaN", Journal of Applied Physics, vol. 78, No. 5, pp. 3008-3011, (1995).

(Continued)

*Primary Examiner* — Matthew Song
(74) *Attorney, Agent, or Firm* — TraskBritt

(57) ABSTRACT

The present invention provides methods for fabricating a composite substrate including a supporting substrate and a layer of a binary or ternary material having a crystal form that is non-cubic and semi-polar or non-polar. The methods comprise transferring the layer of a binary or ternary material from a donor substrate to a receiving substrate.

9 Claims, 2 Drawing Sheets

(56) References Cited

U.S. PATENT DOCUMENTS

| | | | |
|---|---|---|---|
| 2003/0205721 A1 | 11/2003 | Nishii et al. | 257/194 |
| 2003/0219959 A1 | 11/2003 | Ghyselen et al. | 438/458 |
| 2004/0014299 A1 | 1/2004 | Moriceau et al. | 438/459 |
| 2004/0235268 A1 | 11/2004 | Letertre et al. | 438/459 |
| 2005/0189323 A1 | 9/2005 | Ghyselen et al. | 216/88 |
| 2005/0266626 A1 | 12/2005 | Faure et al. | 438/197 |
| 2005/0269671 A1 | 12/2005 | Faure et al. | 257/618 |
| 2006/0091400 A1 | 5/2006 | Faure et al. | 257/76 |
| 2007/0072324 A1 | 3/2007 | Krames et al. | 438/46 |
| 2007/0111531 A1* | 5/2007 | Baker et al. | 438/724 |

FOREIGN PATENT DOCUMENTS

| | | | | |
|---|---|---|---|---|
| WO | WO 02/37556 | | 5/2002 | |
| WO | WO 02/43112 A2 * | | 5/2002 | H01L 21/20 |
| WO | WO 2004/084275 A2 | | 9/2004 | |

OTHER PUBLICATIONS

E. Hugonnard-Bruyère et al., "Electrical and Physical Behavior of SiC Layers on Insulator (SiCOI)", Materials Science Forum, vols. 338-342, pp. 715-718, (2000).

A.J. Auberton-Hervé et al, XP001090987, "Why can Smart-Cut Change the Future of Microelectronics?", Int. Journal of High Speed Electronics and Systems, vol. 10, No. 1, pp. 131-146 (2000).

B. Aspar et al: XP001147473, "Smart-Cut Technology: Used for High Volume SOI Wafer Production", Silicon Wafer Bonding Technology for VLSI and MEMS Applications, vol. 510, No. 13, pp. 33-51 (2002).

A. Tauzin et al., "Transfers of 2-Inch GaN Films Onto Sapphire Substrates Using Smart Cut™ Technology", Electronics Letters, vol. 41, No. 11, (2005).

L. Di Cioccio et al, XP-002345962, "III-V Layer Transfer Onto Silicon and Applications", Phys. Stat. Sol. (a), vol. 202, No. 4, pp. 509-515 (2005).

* cited by examiner

METHOD FOR MAKING A COMPOSITE SUBSTRATE AND COMPOSITE SUBSTRATE ACCORDING TO THE METHOD

CROSS REFERENCE TO RELATED APPLICATION

This application is a continuation-in-part of U.S. patent application Ser. No. 10/915,765, filed Aug. 10, 2004, now abandoned, the entire disclosure of which is expressly incorporated herein by reference.

FIELD OF THE INVENTION

The present invention relates to a method for making a composite substrate including a supporting substrate and a layer in a binary or ternary material, the method comprising the transfer of a layer of the binary or ternary material onto a supporting substrate also called a receiving substrate. The invention also relates to a composite substrate obtained according to a method as mentioned above.

BACKGROUND OF THE INVENTION

A binary material such as GaN conventionally appears in a polar form, with a particular orientation of the crystalline unit cells of the material. This orientation is expressed at both surfaces of the substrate by asymmetry: one of the two faces will be the "Ga" face, whereas the other opposite face is the "N" face. It is known that growing an active layer of electronic components on polar GaN material oriented along the c axis is easier to achieve with good quality by starting with a Ga face rather than from a N face. Therefore, this involves certain constraints for achieving composite substrates comprising a transferred layer of polar GaN.

There essentially are two types of transfer methods with which such substrates may be obtained. A first known type of method consists of picking up a thin layer of GaN, from the rear "N" face of a GaN donor substrate, in order to transfer this layer onto a receiving substrate. Such a known method bonds the rear face of the GaN layer, as it is desired that the final obtained composite substrate has a front face, which corresponds to its "Ga" face. Regardless of the retained transfer technique, it is necessary to prepare the rear face of the GaN donor substrate before proceeding with the bonding with the receiving substrate. Indeed, an "N" face of a GaN layer requires treatments in order to notably reduce its roughness before bonding it with another surface.

This preparation therefore is a specific operation which corresponds to a cost.

A second known type of method does not require such a treatment of the rear face. In the second type of method, one proceeds with transferring a layer of material such as GaN, by bonding the front face (Ga face) of a donor substrate of this material onto an intermediate substrate. The front face of a GaN layer does not require any treatments as unwieldy as those which should be applied to a rear face of the same material for its bonding.

At the conclusion of this first bonding, a desired thickness of binary material such as GaN is retained on the intermediate substrate. An intermediate composite substrate is thereby obtained, the exposed face of which corresponds to the N rear face of the GaN layer. However, this "N" face is not the face that is desired on the front face of the composite substrate. At the conclusion of this first transfer, a second transfer of a layer of binary material such as GaN, is therefore achieved from the first receiver onto a receiving substrate. This second transfer may further be achieved hereby, e.g., thinning the intermediate substrate. A composite substrate is thereby obtained, the exposed face of which is of the "Ga" type without resorting to a constraining treatment of one rear N face of a GaN layer, in order to allow its bonding.

But this second type of known method requires achieving a transfer on an intermediate substrate, which burdens the manufacturing cost of the composite substrate.

It thus appears that the known methods for obtaining, through one or several transfers, a composite substrate including a layer of binary material such as GaN are associated with different drawbacks.

SUMMARY OF THE INVENTION

The present invention provides methods, and substrates fabricated by the methods, that obviate these drawbacks by limiting the number of operations required for achieving such a composite substrate. The substrates obtained by the invention are notably intended for making electronic components such as light-emitting diodes or laser diodes, for example. For example, the use of composite substrates comprising a layer of binary material such as GaN, on a support in a material such as sapphire is known for making electronic components.

In a preferred embodiment, the invention provides methods for making a composite substrate including a supporting substrate and a layer in a binary or ternary material that includes transfer of a useful layer of the binary or ternary material onto a receiving support, supporting substrate. The binary or ternary material is a non-cubic, semi-polar, or non-polar material. The binary or ternary material preferably can be a nitride compound. The transfer may notably be achieved by a method of the SMART-CUT® type (a general description of which will, for example, be found in the publication "Silicon-On-Insulator Technology: Materials to VLSI, $2^{nd}$ Edition" of Jean-Pierre Collinge, by Kluwer Academic Publishers, pp. 50 and 51). In this case, picking up the GaN layer involves implantation through the rear face of the donor substrate.

Moreover, the receiving support substrate advantageously has a thermal expansion coefficient substantially equal to the thermal expansion coefficient of the binary or ternary material. Alternatively, the thermal expansion coefficient of the receiving support is preferably isotropic and between 0.6 times and 1.6 times the thermal expansion coefficient of the semi-polar or non-polar material.

In another preferred embodiment, the useful layer of the semi-polar or non-polar material can be obtained by removing a thin layer of the front face of a substrate of a semi-polar or non-polar material. The substrate can be a bulk substrate of the semi-polar or non-polar material. Also, the substrate can have a surface layer of the semi-polar or non-polar material that has been deposited by epitaxy on an epitaxial support substrate. All or part of the deposited layer can then be removed. The removing may be by a method of the SMART-CUT® type.

In another preferred embodiment, the invention provides composite substrates for making electronic components or the like including a supporting substrate, a receiving support substrate, and a useful layer in a binary or ternary material characterized in that the binary or ternary material is a non-cubic, semi-polar or non-polar material. The binary or ternary material preferably can be a nitride compound. The composite wafer can also be used as a epitaxial support substrate for further deposition by epitaxy on the layer of binary or ternary material.

Moreover, the receiving support substrate advantageously has a thermal expansion coefficient substantially equal to the thermal expansion coefficient of the binary or ternary material. The thermal expansion coefficient of the receiving support preferably is between 0.6 times and 1.6 times the thermal expansion coefficient of the semi-polar or non-polar material. Moreover, the semi-polar or non-polar material can be selected from the list of the following materials: A-plane or m-plane GaN, R-plane or m-plane sapphire, a-plane or m-plane SiC, $LiAl_xO_y$ and $MgAl_xO_y$. The receiving substrate can be selected from the following materials: c-plane sapphire and monocrystalline c-plane SiC, c-plane GaN, c-plane AlN, polycrystalline AlN or polycrystalline SiC.

The substrates preferably also include a bonding interface between the useful, transferred layer and the receiving support substrate. The bonding interface layers can be: insulating layers such as $SiO_2$, $Si_3N_4$, organic layers such as polyimides, metal interfaces such as an oxide layer, and formation of sealing layers such as $Pd_2Si$, $WSi_2$, SiAu and PdIn. The invention further includes methods for depositing such bonding interface layers and then bonding the useful, transferred layer and the receiving support substrate.

Further aspects, details and alternative combinations of the elements of this invention will be apparent from the following detailed description and are also within the scope of the inventor's invention.

BRIEF DESCRIPTION OF THE DRAWINGS

Others advantages and features will become more apparent from the description of several alternative embodiments, given as non-limiting examples, of the method for making a composite substrate and of the composite substrate obtained according to the method, with reference to the accompanying drawings wherein.

DETAIL DESCRIPTION OF THE PREFERRED EMBODIMENTS

Headings are used herein for clarity only and without any intended limitation.

Throughout the specification, the term "transfer" is understood to mean the transferring from a "donor" substrate onto a "receiving" (or supporting) substrate of a more or less thick layer of material from the donor substrate. During this transfer, the layer to be transferred from the donor substrate is typically put into intimate contact with the receiving substrate in order to achieve bonding. Throughout the specification, the term "composite substrate" is understood to refer to a substrate comprising at least two layers of materials.

Figure 1:
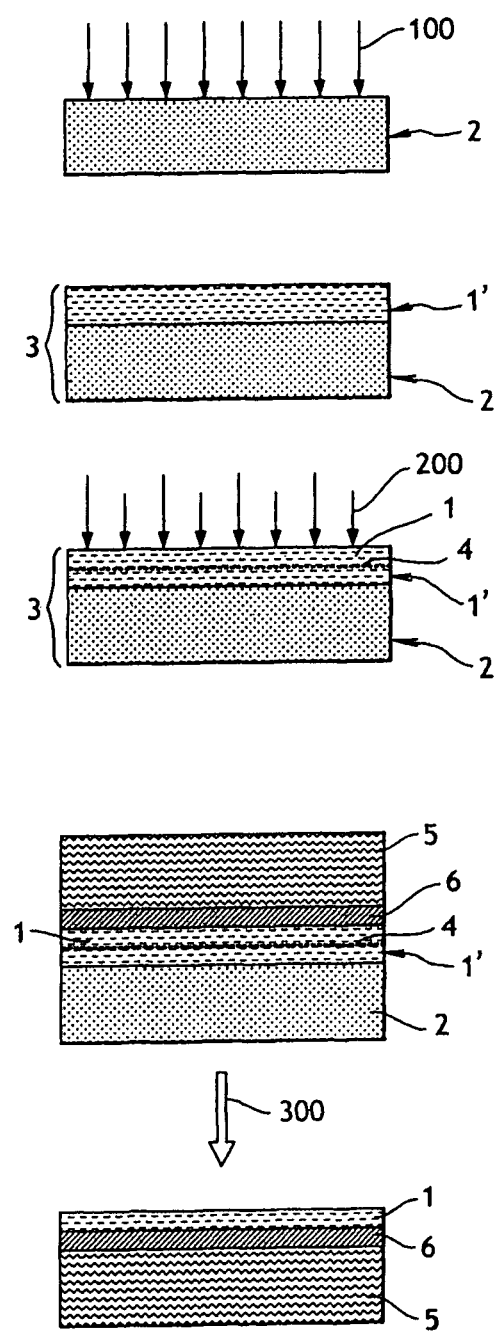
FIG. 1 schematically illustrates steps of an exemplary embodiment of the method according to the invention.

With reference to FIG. 1, the method according to the invention includes a step for depositing a donor layer 1' of material having a semi-polar or non-polar crystal structure by epitaxy 100 on an epitaxy supporting substrate 2. By donor layer 1' is meant the layer on the epitaxy supporting substrate 2 from which stems the useful layer 1 transferred onto a receiving support as this will be detailed later on. An intermediate structure 3 is obtained consisting of a lower epitaxy supporting substrate 2 and a donor layer 1'.

The epitaxy support 2 and the epitaxy parameters 100 are selected so that the donor layer 1' obtained by epitaxy is a material of a non-polar or semi-polar crystalline nature. The epitaxy support 2, for example, can be in r-plane sapphire or m-plane sapphire with which a non-polar or semi-polar GaN donor layer 1' may be obtained by epitaxy. The epitaxy support 2 can also be selected from the list of the following materials: a-plane or m-plane GaN, a- or m-plane SiC, $LiAl_xO_y$ and $MgAl_xO_y$.

It will be noticed that the epitaxy support 2 has a crystalline structure suitable for forming a donor layer 1' of a non-polar or semi-polar binary material. Moreover, it will be noted that the advantage of using a semi-polar or non-polar material lies in the fact that this type of material does not have any surface polarity and thus allows epitaxial reworking regardless of the exposed face of the material.

The transfer of all or part of the donor layer 1', the useful layer 1, onto a receiving support or supporting substrate 5 is performed by a step 200 for implanting the intermediate structure 3, followed by bonding of the donor layer 1' onto the receiving substrate 5. The implantation step 200 consists of implanting one or more atomic species at a determined depth of the donor layer 1' of the intermediate structure 3 in order to form an embrittlement area 4 therein in order to apply SMART-CUT® transfer.

The donor layer 1' of the intermediate structure 3 is then bonded to the receiving substrate 5. In this particular embodiment of the method according to the invention, the donor layer 1' is bonded onto the receiving substrate 5 by means of a bonding interface 6 deposited on the surface of the receiving substrate 5.

This bonding interface 6 consists in a layer of insulator, such as $SiO_2$, $Si_3N_4$, etc., and in a layer of conductive material depending on future applications of the final substrate. This bonding interface 6 can, for example, be: organic layers, like polyimides; metal interfaces; insulating interfaces such as a silicon oxide layer; and formation of sealing layers such as $Pd_2Si$, $WSi_2$, SiAu and PdIn.

In a step 300, all or part of the donor layer 1' is then detached at the embrittlement area 4 in order to transfer the useful layer 1 on the receiving substrate 5. The step 200 for implanting atomic species and for detaching 300 the donor layer 1 corresponds to the SMART-CUT® type method. This method consists in implanting ions or gas species, e.g., hydrogen gas or ions, or helium gas or ions, or a mixture thereof, from the upper face of the donor layer 1' so as to form the buried embrittlement area 4 therein.

Moreover, detachment 300 of the useful layer 1 is performed by a fracture in the embrittlement area 4 leading to detachment of the useful layer 1. Nevertheless, it is obviously straightforward that the detachment of the useful layer 1 may be achieved by any other means well-known to the skilled practitioner such as, for example, by thinning the epitaxy supporting substrate 2 by following a method of the BESOI type, for example.

The receiving substrate 5 is obtained in a material for which the thermal expansion coefficient (TEC) is between 0.6 and 1.6 times the TEC of the non-polar or semi-polar material of the useful layer 1 over the whole temperature range of the relevant methods. Preferably, the receiving substrate 5 is obtained in a material with anisotropic thermo-mechanical properties in the bonding plane and the useful layer 1 is obtained in a non-polar or semi-polar material with isotropic thermo-mechanical properties in the bonding plane. The semi-polar or non-polar material can be: a- or m-plane GaN, a-plane or r-plane sapphire, mono-crystalline a- or m-plane SiC, $LiAl_xO_y$ and $MgAl_xO_y$ and the receiving substrate 5 is obtained in a material that can be c-plane sapphire and monocrystalline c-plane SiC or polycrystalline SiC, monocrystalline c-plane AlN or polycrystalline AlN, or c-plane GaN.

Thus, during possible heat treatments that the structure will undergo, the useful layer 1 and the receiving subtrate 5 will substantially expand in the same way even if they have different thermo-mechanical properties according to their crystalline orientation while having close TECs. Moreover, it will be noticed that structures may be buried into the bonding interface 6 of the composite substrate obtained according to the method.

Figure 2:
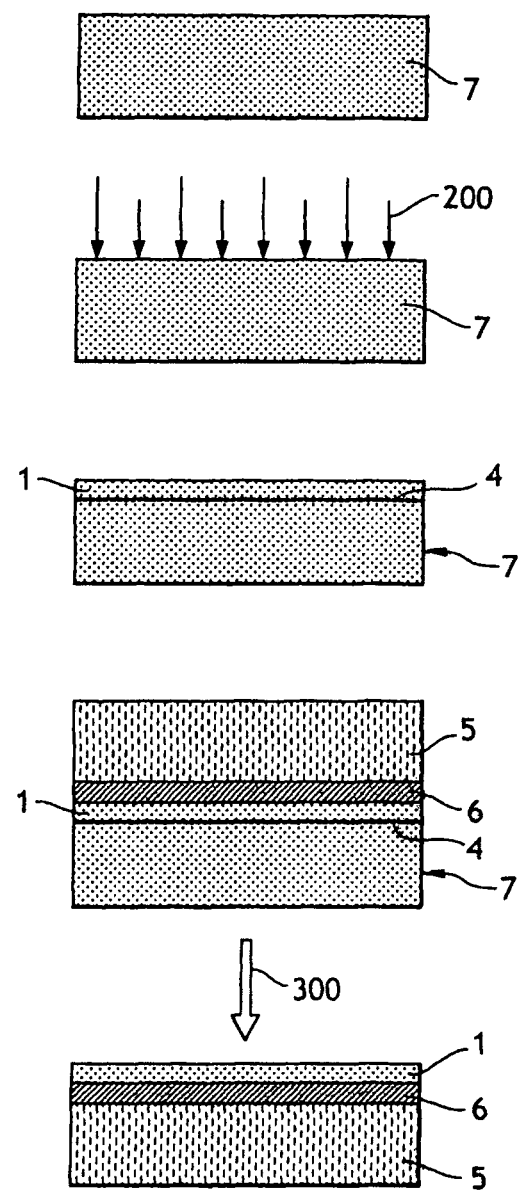
FIG. 2 schematically illustrates steps of another exemplary embodiment of the method according to the invention.

According to an alternative embodiment of the method according to the invention, with reference to FIG. 2, a useful layer 1 is achieved by transferring a thin layer from the front face of a bulk substrate 7 of a non-polar or semi-polar material, onto a receiving substrate 5. The step for transferring the useful layer 1 includes a step for implanting one or several atomic species 200 at a determined depth of the bulk substrate 7 in order to form an embrittlement area 4 therein.

The bonding of the useful layer 1 onto the receiving substrate 5 is performed by bonding the surface layer of the bulk substrate 7 onto the receiving substrate 5. This bonding puts the implanted layer, the useful layer 1 of the bulk substrate 7 into intimate contact with the receiving substrate 5 in order to assemble them. In this particular exemplary embodiment of the method according to the invention, the bulk substrate 7 is bonded onto the receiving substrate 5 by means of a bonding interface 6 deposited on the surface of the receiving substrate 5.

Subsequently, in a step 300, a thin layer is detached at the embrittlement area 4 in order to form the useful layer 1. The step 200 for implanting atomic species and for detaching 300 the useful layer 1 preferably corresponds to a method of the SMART-CUT® type. Detachment of the useful layer 1 may be obtained by any other means well-known to the skilled practitioner as, for example, by thinning the bulk substrate 7 according to a BESOI type method.

In the same way as described above, the receiving substrate 5 is obtained in a material for which the thermal expansion coefficient (TEC) is between 0.6 and 1.6 times the TEC of the non-polar or semi-polar material of the useful layer 1 over the whole temperature range of the relevant methods. Further, the receiving substrate 5 is obtained in a material with anisotropic thermo-mechanical properties in the bonding plane and the useful layer 1 is obtained in a non-polar or semi-polar isotropic material with isotropic thermo-mechanical properties in the bonding plane.

By applying this method, a final substrate is obtained for which the TEC difference between the useful layer 1, and the receiving substrate 5 is smaller that that existing at the structure 3, i.e., the TEC difference between the donor layer 1' and the epitaxy support 2.

The thereby obtained structure then allows an epitaxy of very good quality to be achieved on the useful layer.

EXAMPLES

Two particular exemplary, but non-limiting, embodiments of a substrate obtained according to the invention will be described hereafter, with reference to FIG. 1.

Example 1

According to this example, an epitaxy of a donor layer 1' in a-plane GaN is achieved, for which the thermal expansion coefficient is of the order of $6.1 \pm 0.8 \times 10^{-6}$ at 1,000° C. on a c-plane sapphire epitaxy support 2 with an average TEC of $8.30 \pm 0.1 \times 10^{-6}$, along all the directions of the bonding plane, at a temperature of 1,000° C. It will be noticed that the epitaxy supporting substrate 2 may be in r-plane sapphire, the TEC of r-plane sapphire being of about $8.69 \pm 0.4 \times 10^{-6}$, depending on the crystalline direction of the relevant bonding plane, at a temperature of 1,000° C.

An embrittlement area 4 is then achieved by implantation 200 of atomic species at a determined depth of the donor layer 1'. This donor layer 1' in a-plane GaN is then bonded, by means of a bonding oxide interface 6, onto a receiving substrate 5 obtained in c-plane sapphire for which the TEC is of the order of $8.30 \pm 0.1 \times 10^{-6}$ at a temperature of 1,000° C.

In a step 300, the useful layer 1 of the donor layer 1' is then detached in order to form the final substrate. It will thus be noted that the thermal expansion coefficient of the receiving substrate 5 is globally equal to 1.36 times the thermal expansion coefficient of the semi-polar or non-polar material in which the useful layer 1 was obtained.

Moreover, it will be noticed that for forming the donor layer 1', it is preferable to achieve non-polar or semi-polar GaN epitaxy on a substrate obtained in a material for which the thermal expansion coefficient (TEC) is globally equal to the TEC of c-plane sapphire rather than to that of r- or m-plane sapphire.

Example 2

According to this second example, one starts with a bulk r-plane sapphire substrate (therefore anisotropic) for which the thermal expansion coefficient is of the order of $8.72 \pm 0.5 \times 10^{-6}$ depending on the crystalline direction of the relevant bonding plane, at a temperature of 1,000° C. An embrittlement area 4 is then achieved by implantation 200 of atomic species at a determined depth in the bulk substrate 7 corresponding to the thickness of the useful layer 1, which is intended to be transferred onto the receiving substrate 5.

The implanted surface of the useful layer of the bulk substrate 7 is bonded, by means of a bonding oxide interface 6 deposited on an isotropic receiving substrate 5 obtained in c-plane sapphire for which the thermal expansion coefficient is of the order of $8.30 \pm 0.1 \times 10^{-6}$, along all the directions of the bonding plan, at a temperature of 1,000° C. In step 300, the useful layer 1 is then detached from the bulk substrate 7 in order to form the final structure.

It will thus be noticed that the thermal expansion coefficient of the receiving substrate 5 is globally equal to the thermal expansion coefficient of the semi-polar or non-polar material of the useful layer, the thermal expansion coefficient of the receiving substrate 5 being equal to 1.01 times the thermal expansion coefficient of the material of the useful layer 1. Further, the TEC of this structure is then isotropic in the plane parallel to the surface of the substrate, which is not the case in the original substrate 7.

Finally, it is obvious that the examples which have just been described are by no means limiting as to the fields of application of the invention.

The preferred embodiments of the invention described above do not limit the scope of the invention, since these embodiments are illustrations of several preferred aspects of the invention. Any equivalent embodiments are intended to be within the scope of this invention. Indeed, various modifications of the invention in addition to those shown and described herein, such as alternative useful combinations of the elements described, will become apparent to those skilled in the art from the subsequent description. Such modifications are also intended to fall within the scope of the appended claims. In the following (and in the application as a whole), headings and legends are used for clarity and convenience only.

A number of references are cited herein, the entire disclosures of which are incorporated herein, in their entirety, by reference for all purposes. Further, none of the cited references, regardless of how characterized above, is admitted as prior to the invention of the subject matter claimed herein.

What is claimed is:

1. A method for fabricating electronic components using a composite substrate, comprising:
   removing a layer comprising a binary or ternary material which has a crystalline form that is both non-cubic and also semi-polar from the upper face of a donor substrate, wherein the donor substrate is a bulk substrate comprising the binary or ternary material having a crystalline form that is non-cubic and that is semi-polar;
   transferring the removed layer onto a receiving substrate without reducing a surface roughness of the removed layer prior to transferring the removed layer onto the receiving substrate from the donor substrate;
   depositing at least one additional layer of semiconductor material by epitaxy on the transferred layer on the receiving substrate; and
   fabricating electronic components using the at least one additional layer of semiconductor material while the at least one additional layer of semiconductor material remains bonded to the receiving substrate.

2. The method of claim 1, wherein the binary or ternary material of the semi-polar material comprises a nitride compound.

3. The method of claim 1, wherein the receiving substrate comprises a material with a thermal expansion coefficient substantially equal to the thermal expansion coefficient of the binary or ternary material of the semi-polar material.

4. The method of claim 1, wherein the receiving substrate comprises a material with an isotropic thermal expansion coefficient between 0.6 times and 1.6 times the thermal expansion coefficient of binary or ternary material of the semi-polar material.

5. The method of claim 1, further comprising:
   providing a substrate having a crystalline structure suitable for growing a semi-polar material; and
   depositing by epitaxy a layer of the binary or ternary material with a crystalline form that is both non-cubic and semi-polar.

6. The method of claim 1, wherein removing the layer further comprises:
   implanting ions or gas species through the upper face of the donor substrate so as to form a buried zone of embrittlement therein; and
   fracturing the embrittlement zone so as to detach the layer from the donor substrate.

7. The method of claim 1, wherein the receiving substrate comprises c-plane sapphire, or mono-c-plane SiC, or c-plane GaN, or c-plane AlN, or polycrystalline AlN, or polycrystalline SiC.

8. The method of claim 1, wherein transferring further comprises bonding the removed layer to the receiving substrate, and wherein the bonding further comprises applying a layer of a bonding interface material onto the surfaces of either one or both of the removed layer and the receiving substrate that are to be bonded.

9. The method of claim 8, wherein the bonding interface material comprises insulating material, or $SiO_2$, or $Si_3N_4$, or organic material, or polyimides, or metals, or oxides, or sealing material, or $Pd_2Si$, or $WSi_2$, or SiAu, or PdIn.

* * * * *